United States Patent
Chen et al.

(10) Patent No.: US 8,692,550 B2
(45) Date of Patent: **\*Apr. 8, 2014**

(54) METHOD AND APPARATUS FOR ACQUIRING MAGNETIC RESONANCE IMAGING SIGNALS

(75) Inventors: Jyh-Horng Chen, Taipei (TW); Tzi-Dar Chiueh, Taipei (TW); Edzer L. Wu, Taipei (TW)

(73) Assignee: National Taiwan University, Taipei (TW)

( * ) Notice: Subject to any disclaimer, the term of this patent is extended or adjusted under 35 U.S.C. 154(b) by 331 days.

This patent is subject to a terminal disclaimer.

(21) Appl. No.: 13/050,715

(22) Filed: Mar. 17, 2011

(65) Prior Publication Data
US 2012/0235682 A1    Sep. 20, 2012

(51) Int. Cl.
G01R 33/44 (2006.01)
G01R 33/483 (2006.01)

(52) U.S. Cl.
CPC .................. *G01R 33/4835* (2013.01)
USPC .......................... 324/309; 324/307

(58) Field of Classification Search
CPC .................................. G01R 33/4835
USPC .......... 324/300–322; 600/410, 413; 382/128, 382/131
See application file for complete search history.

(56) References Cited

U.S. PATENT DOCUMENTS

| 6,853,188 | B2* | 2/2005 | Feinberg et al. | 324/307 |
| 2009/0278538 | A1* | 11/2009 | Chen et al. | 324/309 |
| 2010/0148773 | A1* | 6/2010 | Chen et al. | 324/309 |
| 2011/0254550 | A1* | 10/2011 | Chen et al. | 324/309 |

OTHER PUBLICATIONS

Wu, E.L. et al.; "Ultra-fast Brain MR Imaging Using Simultaneous Multi-slice Acquisition (SMA) Technique"; Aug. 2007; Proceedings of the 29th Annual International Conference of the IEEE EMBS Cité Internationale; pp. 2618-2621.*
Hendrick, Edward et al. "Glossary of MR Terms." Copyright 2005. American College of Radiology. Fifth Edition. <http://www.acr.org/Quality-Safety/Resources/MRI-Glossary>.*
K. Setompop et al., Blipped Caipirhina for simultaneous multi-slice EPI with reduced g-factor penalty, ISMRM ESMRMB Joint Annual Meeting 2010.

* cited by examiner

*Primary Examiner* — Melissa Koval
*Assistant Examiner* — Rishi Patel
(74) *Attorney, Agent, or Firm* — Morris Manning & Martin LLP; Tim Tingkang Xia, Esq.

(57) ABSTRACT

A method for acquiring MRI signals includes: applying one or more than one RF pulse, which carries at least two frequency components, and a slice/slab selection gradient to a subject, so that at least two slices/slabs of the subject respectively corresponding to the at least two frequency components are excited simultaneously; applying a plurality of spatial encoding gradients; applying a plurality of separation gradients for separating the at least two slices/slabs; and applying at least one coherent refocusing gradient between the plurality of separation gradients.

18 Claims, 13 Drawing Sheets

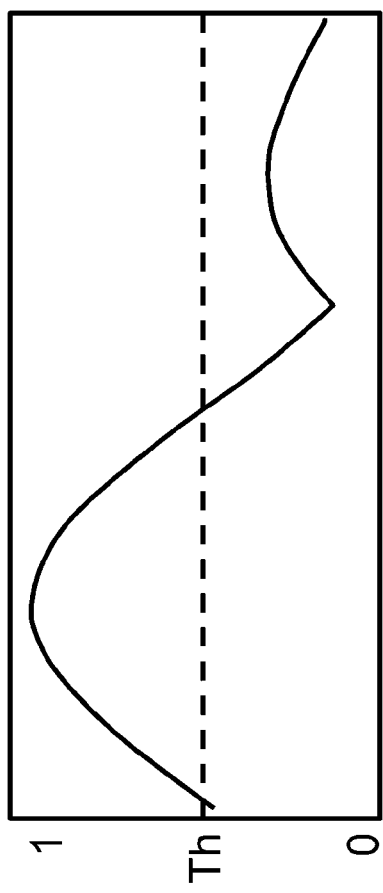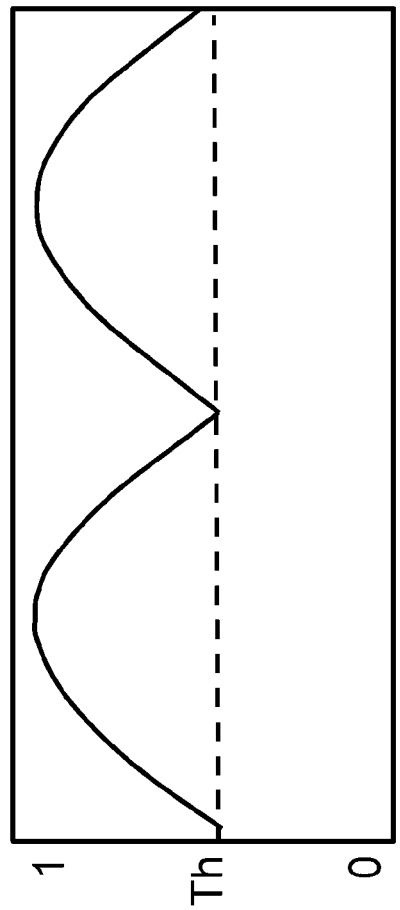

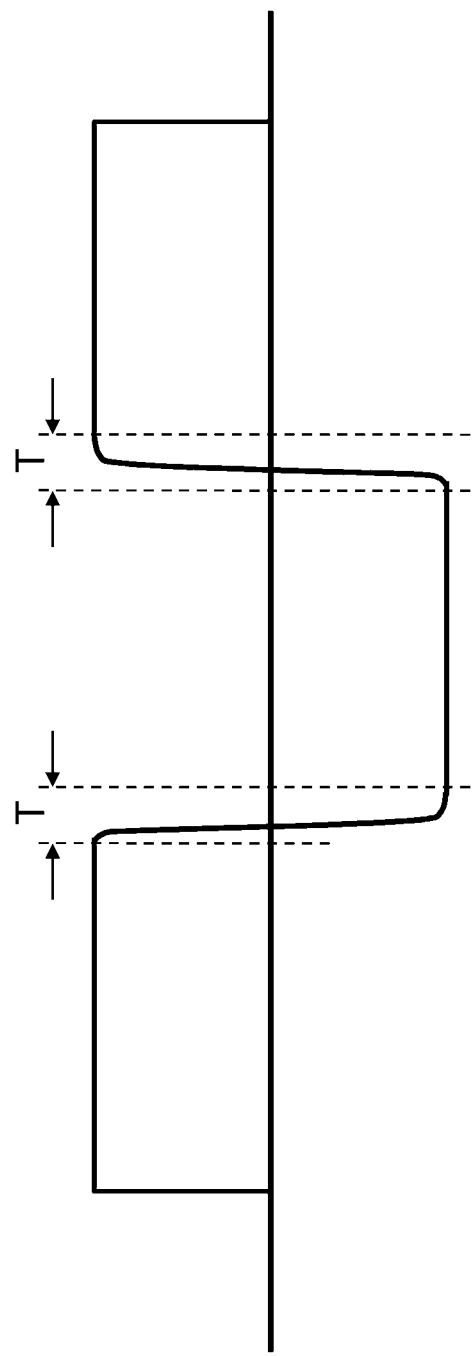

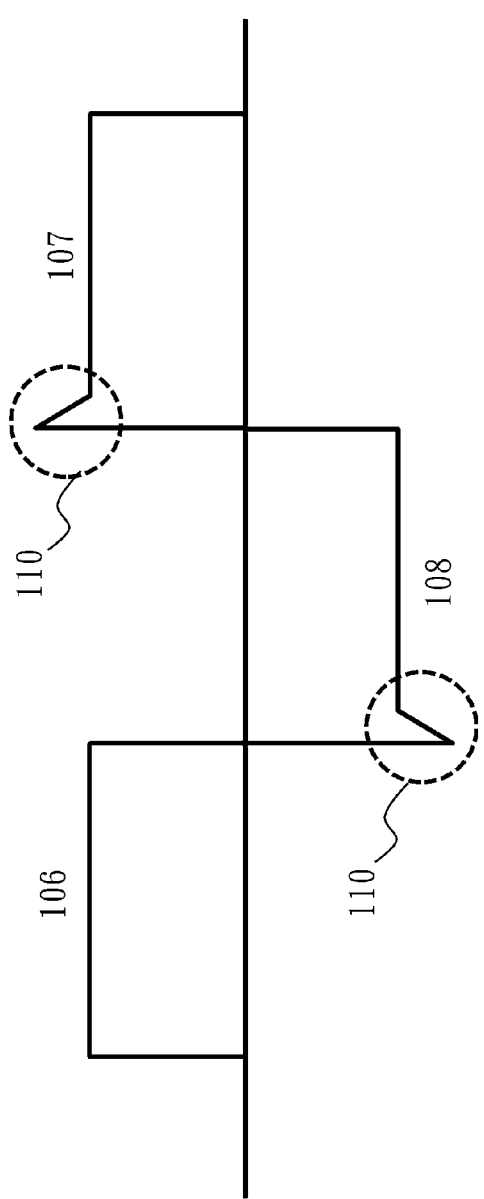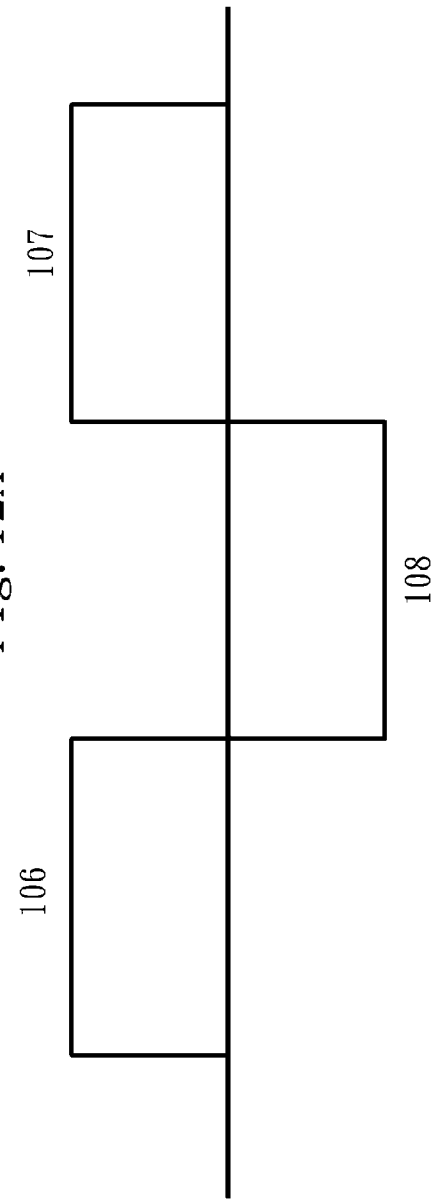

METHOD AND APPARATUS FOR ACQUIRING MAGNETIC RESONANCE IMAGING SIGNALS

BACKGROUND

1. Field of the Invention

The present invention relates to a method and an apparatus for acquiring magnetic resonance imaging (MRI) signals, and more particularly to a method and an apparatus for simultaneously acquiring multi-slice/slab MRI signals including applying at least one coherent refocusing gradient.

2. Background of the Invention

A magnetic resonance imaging (MRI) apparatus is configured to reconstruct MR images based on MR signals. An MRI apparatus typically applies a static magnetic field, a gradient magnetic field, and a radio frequency (RF) signal having a selected frequency to a subject to excite a selected nucleus type and then detects the MR signals responsively sent by the excited nucleus.

Referring to FIG. 1, in a conventional procedure of 2D spatial encoding, only one single slice of the subject can be processed at a time; that is, multi-slice images are acquired from multiple scans along a scan direction. Therefore, one image is obtained from one scan; N images are obtained from N times of scan. The time required for acquiring the images of all the slices can be calculated as Equation 1 (Eq. 1).

Time required for acquiring the images of all the slices $$=NEX \times N_{pe} \times TR \times N_{slice}, \quad (\text{Eq. 1})$$

where NEX denotes the average number of repeated signaling of a single slice and $N_{pe}$ is the whole number of encoding. For the 2D MR image, $N_{pe}$ denotes the number of phase encoding $N_p$ (scan lines in the k-space), TR denotes the time required for acquiring a scan line in the k-space, and $N_{slice}$ denotes the number of the slices. For example, if there are on the total 256 128×128 images to be acquired, then $N_{slice}$=256, NEX=1, $N_{pe}$=128, TR=0.1 second, and the time required for acquiring the images of all the slices is about 54 minutes. This is indeed a time-consuming procedure.

Referring to FIG. 2, in a conventional procedure of 3D spatial encoding, in one scan only one single slab of the subject can be excited to give the images of all the slices. Also, the time required for acquiring the 3D MR image is calculated as Eqn. 1, but the whole number of encoding $N_{pe}=N_p \times N_z$, wherein $N_p$ is the number of phase encoding and $N_z$ is the number of phase encoding. Thus, it is apparent that more time is required for acquiring the 3D MR images.

Our previous application (US Publication No. 20090278538) has revealed a novel method and apparatus for simultaneously acquiring multiple slices/slabs in magnetic resonance system. The method comprises the following steps: applying one or more than one RF pulse 301, which carries at least two frequency components, and a slice/slab selection magnetic field gradient 104 so that at least two slices/slabs of the subject respectively corresponding to the at least two frequency components can be excited simultaneously; applying spatial encoding magnetic field gradients 102, 103; and applying a slice/slab separation magnetic field gradient 105 so as to separate the at least two slices/slabs. The method according to the previous invention can be used to acquire data for simultaneously reconstructing multiple slices/slabs.

However, the images acquired by the said method can be blurry. The level of blur is required to be set in a preset range so that sharp and acceptably clear images can be acquired. To mitigate the image blur problem, the thickness of a slice is limited from above. Otherwise, when the level of blur is higher than 3 pixels, the quality of the acquired MR images is poor.

SUMMARY

A method for acquiring magnetic resonance imaging signals comprising applying at least one coherent refocusing gradient between a plurality of separation gradients is described herein.

A method for acquiring MRI signals includes: applying one or more than one RF pulse, which carries at least two frequency components, and a slice/slab selection gradient to a subject, so that at least two slices/slabs of the subject respectively corresponding to the at least two frequency components are excited simultaneously; applying a plurality of spatial encoding gradients; applying a plurality of separation gradients for separating the at least two slices/slabs; and applying at least one coherent refocusing gradient between the plurality of separation gradients.

An apparatus for simultaneously acquiring multi-slice/slab MRI images from a subject, the apparatus being capable of imaging by generating a MRI signal from the subject, the apparatus comprising: an RF excitation module, being controlled for applying one or more than one RF pulse, which carries at least two frequency components, and a slice/slab selection gradient to a subject, so that at least two slices/slabs of the subject respectively corresponding to the at least two frequency components are excited simultaneously; applying a plurality of spatial encoding gradients; applying a plurality of separation gradients for separating the at least two slices/slabs; and applying at least one coherent refocusing gradient between the plurality of separation gradients.

These and other features, aspects and embodiments are described below in the section entitled "Description of the preferred embodiment."

BRIEF DESCRIPTION OF THE DRAWINGS

FIG. 9 shows one example of the acquired filtering shape data and a signal attenuation threshold.

FIG. 11 shows one non-ideal example of the separation gradients.

FIG. 12 shows Input gradient waveform and actual gradient waveform with additional overdrive signals.

DESCRIPTION OF THE PREFERRED EMBODIMENT

In the following description, it should be first noted that similar elements are denoted by the same numbers and, for the purpose of convenience, the symbol "/" means "or". In addition, coordinates (X, Y, Z) are used with respect to the coordinates of images but are not absolute spatial coordinates about an MRI system.

The methods described herein make it possible to simultaneously excite and acquire MR images of different locations in a subject. These embodiments are compatible with a variety of existing MRI systems. Moreover, they do not require extra coils/RF channels, extra time for computation of image information, or extra computer equipment. The embodiments described herein can be applied to MRI systems by means of echo planar imaging, perfusion, image flow, angiogram, image temperature, T1 imaging (lattice-spin relaxation time constant), T2 imaging (spin-spin relaxation time constant), diffusion and the like.

Figure 1:
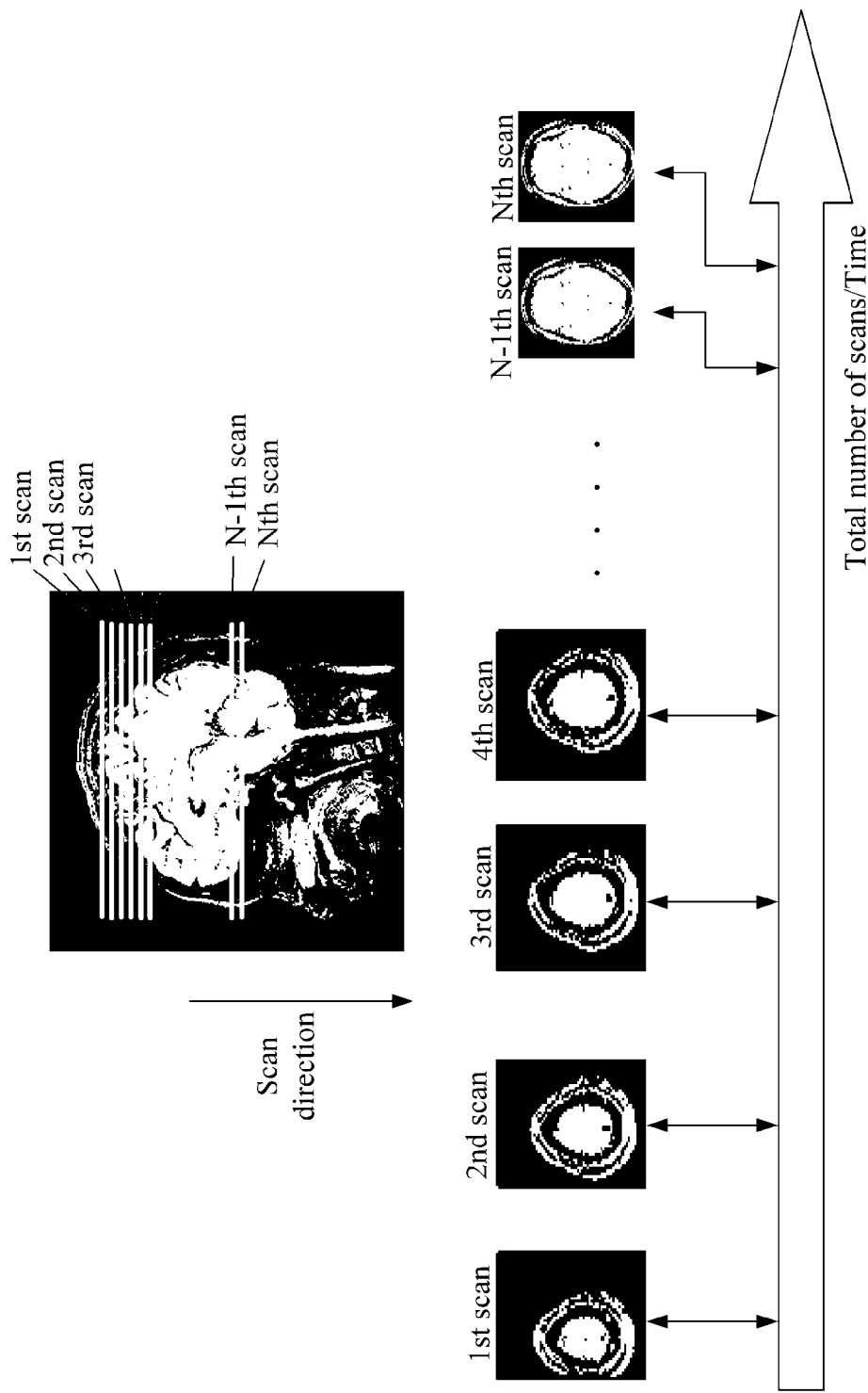
FIG. 1 is a schematic diagram, showing that, in a conventional procedure of 2D spatial encoding, only one single slice of the subject can be processed at a time and N images are given at N scans.
Figure 2:
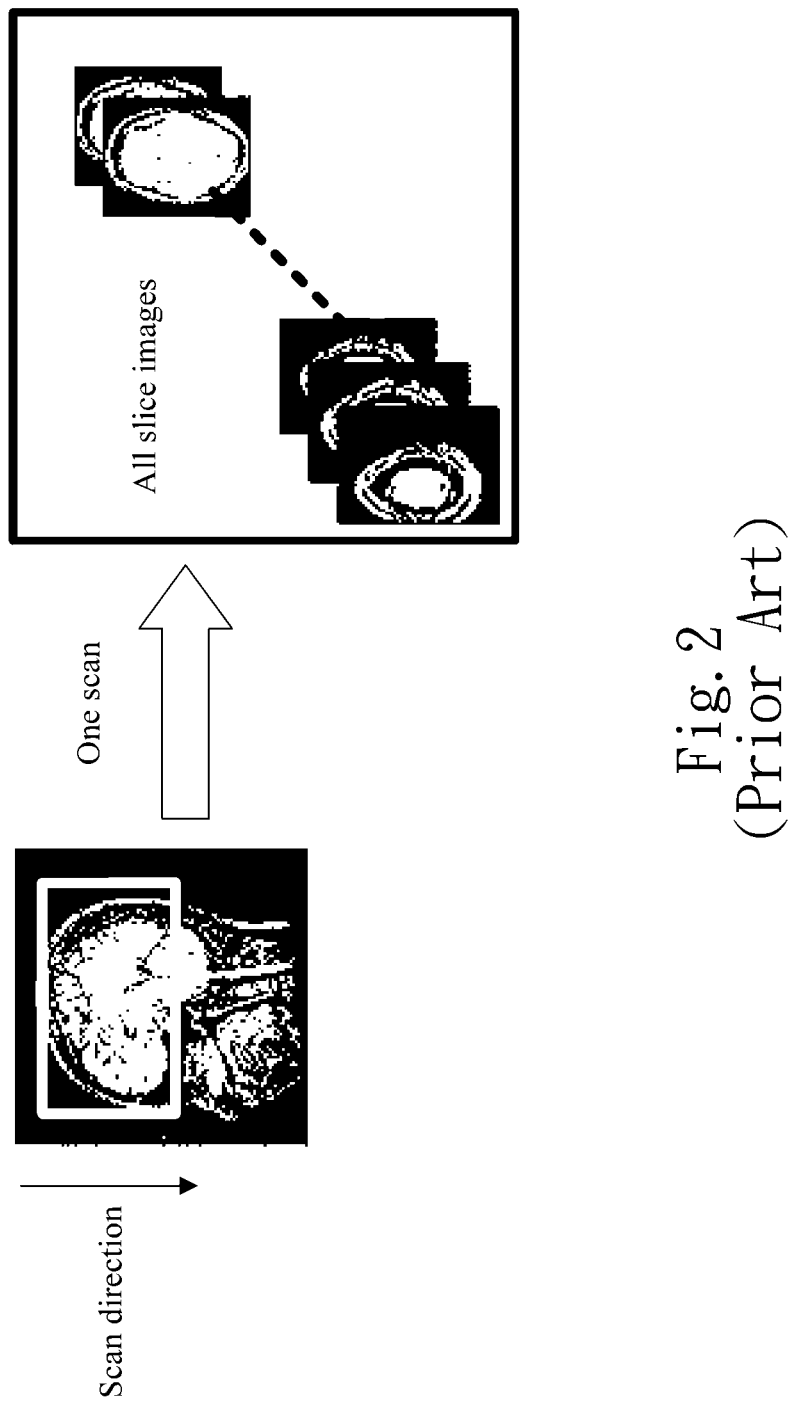
FIG. 2 is a schematic diagram, showing that, in a conventional procedure of 3D spatial encoding, only one single slab of the subject can be excited to give N images.
Figure 3:
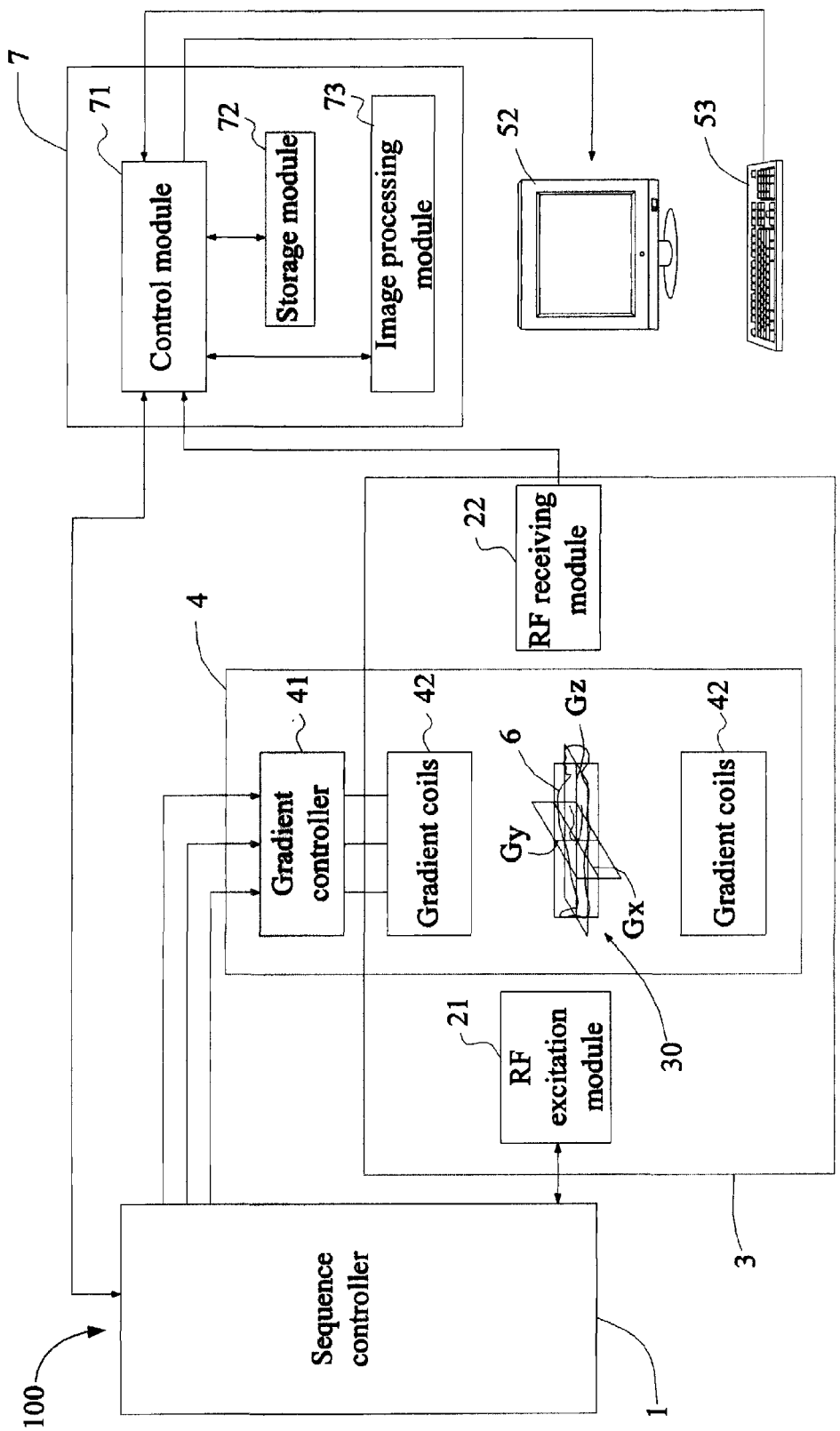
FIG. 3 is a block diagram illustrating an example of the inventive apparatus for simultaneously acquiring multi-slice MRI signals, wherein the apparatus is capable of imaging in accordance with one embodiment.

FIG. 3 is a diagram illustrating an exemplary apparatus 100 for simultaneously acquiring multi-slice or multi-slab MRI signals from a subject in accordance with one embodiment, wherein the apparatus 100 is capable of imaging by generating a MRI signal from the subject.

Referring to FIG. 3, the imaging apparatus 100 comprises a sequence controller 1, an RF excitation module 21 for emitting an excited waveform, an RF receiving module 22 for receiving MR image signals, a static magnetic field output module 3, a gradient output module 4, a main console 7, a display device 52, and an input device 53. The RF excitation module 21 and the RF receiving module 22 can each be an RF coil with either a single channel or multiple channels. The gradient output module 4 can be provided with a gradient controller 41 and a plurality of gradient coils 42. The main console 7 has a control module 71, a storage module 72, and an image processing module 73.

A subject 6 can be positioned within a measurement space 30. In the measurement space 30, there are a uniform magnetic field generated by the static magnetic field output module 3 and a gradient generated by the gradient coils 42, which is under the control of the gradient controller 41. The uniform magnetic field cooperating with the gradient is used for the subject 6 to generate the magnetization as a source of the MRI signals. The method for imaging using the above apparatus is described below.

Figure 4:
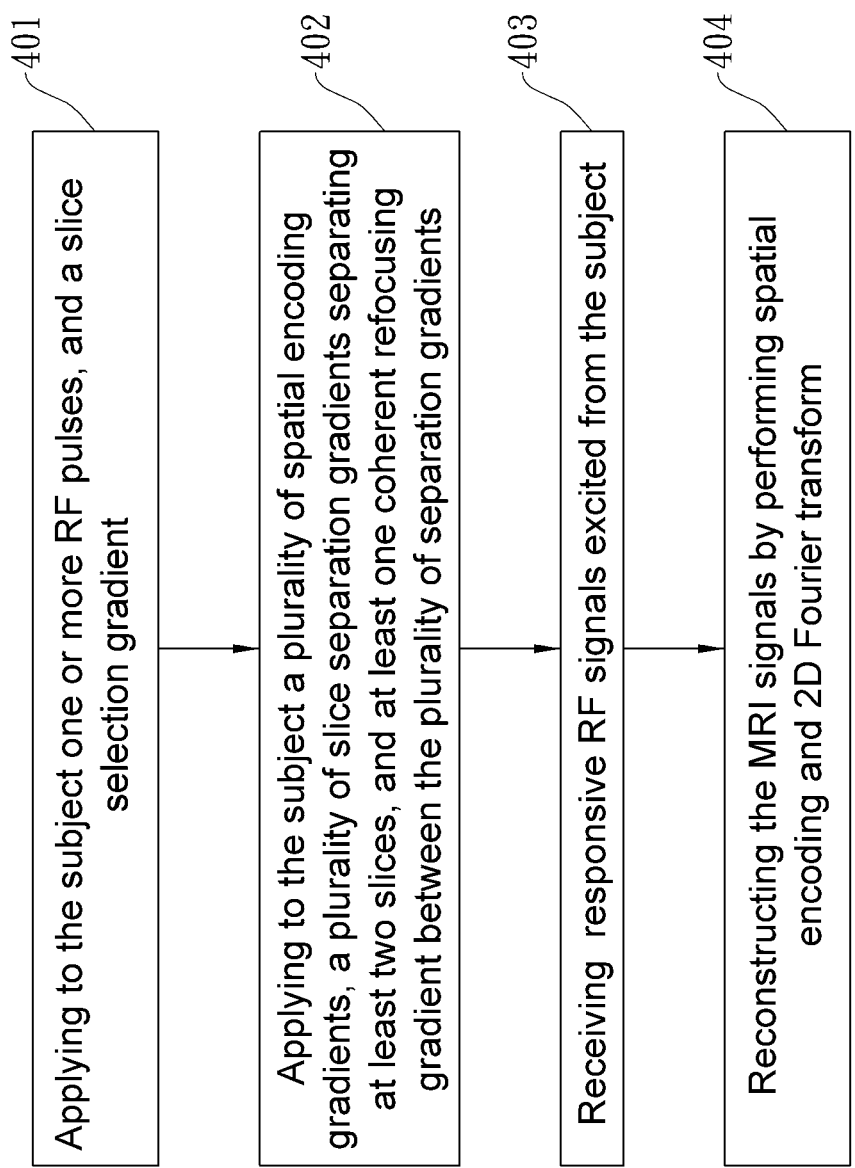
FIG. 4 is a flow chart illustrating an example method for simultaneously acquiring multi-slice MRI signals, wherein the apparatus is capable of imaging in accordance with one embodiment.

FIG. 4 is a flowchart illustrating an exemplary method for simultaneously acquiring multi-slice MRI 2D signals from a subject in accordance with one embodiment.

Referring to FIG. 3 and FIG. 4, in step 401, the RF excitation module 21 is controlled for applying one or more than one RF pulses, which carries at least two frequency components, and a slice selection gradient to the subject 6, so that at least two slices of the subject 6 respectively corresponding to the at least two frequency components are excited simultaneously.

For example, the RF pulse 101 carrying frequencies $f_1$ and $f_2$ for exciting two slices has $f_1$ and $f_2$ designed to have a frequency difference $f_{sep}$ such that $$f_{sep} = d_{sep} \times \gamma \times G_{ss}. \quad \text{(Eq. 2)}$$

$d_{sep}$ denotes the absolute distance (in centimeters) between the two adjacent slices that correspond to the two frequencies, wherein two adjacent slices mean two neighboring slices excited by a plurality of frequencies carried by an RF pulse. $\gamma$ denotes the atomic gyromagnetic ratio. $G_{ss}$ denotes the intensity of the slice-selection gradient (in Gauss/centimeter).

In step 402, the gradient output module 4 applies to the subject 6 a plurality of spatial encoding gradients $G_{spen}$, a plurality of slice separation gradients $G_{sep}$ for separating at least two slices, and at least one coherent refocusing gradient $G_C$ between the plurality of separation gradients $G_{sep}$. The spatial encoding gradients $G_{spen}$ comprise a phase-encoding gradient $G_Y$ and a frequency-encoding gradient $G_X$.

The ratio of $G_{sep}$ to $G_{spen}$, which may be the phase-encoding gradient $G_Y$ or the frequency-encoding gradient $G_X$ and cooperates with $G_{sep}$ to receive MRI signals, should meet a relation as follows:

$$G_{sep}/G_{spen} \geq = FOV_{spen}/d_{sep}. \quad \text{(Eq. 3)}$$

$FOV_{spen}$ denotes a field (e.g. width) (in centimeters) of view along the direction of the spatial encoding gradient $G_{spen}$. $d_{sep}$ denotes the absolute distance (in centimeters) between the two adjacent slices that correspond to the two frequencies. The two adjacent slices can be separated completely as demonstrated by Eq. 3.

In step 403, the gradient output module 4, in the course of applying the spatial encoding gradients (phase-encoding gradient $G_Y$ and a frequency-encoding gradient $G_X$), cooperates with the RF receiving module 22 to receive responsive RF signals excited from the subject 6.

In step 404, the MRI signals are reconstructed by Fourier transform to the responsive RF signals, so as to give the real-time image of each slice.

Figure 5:
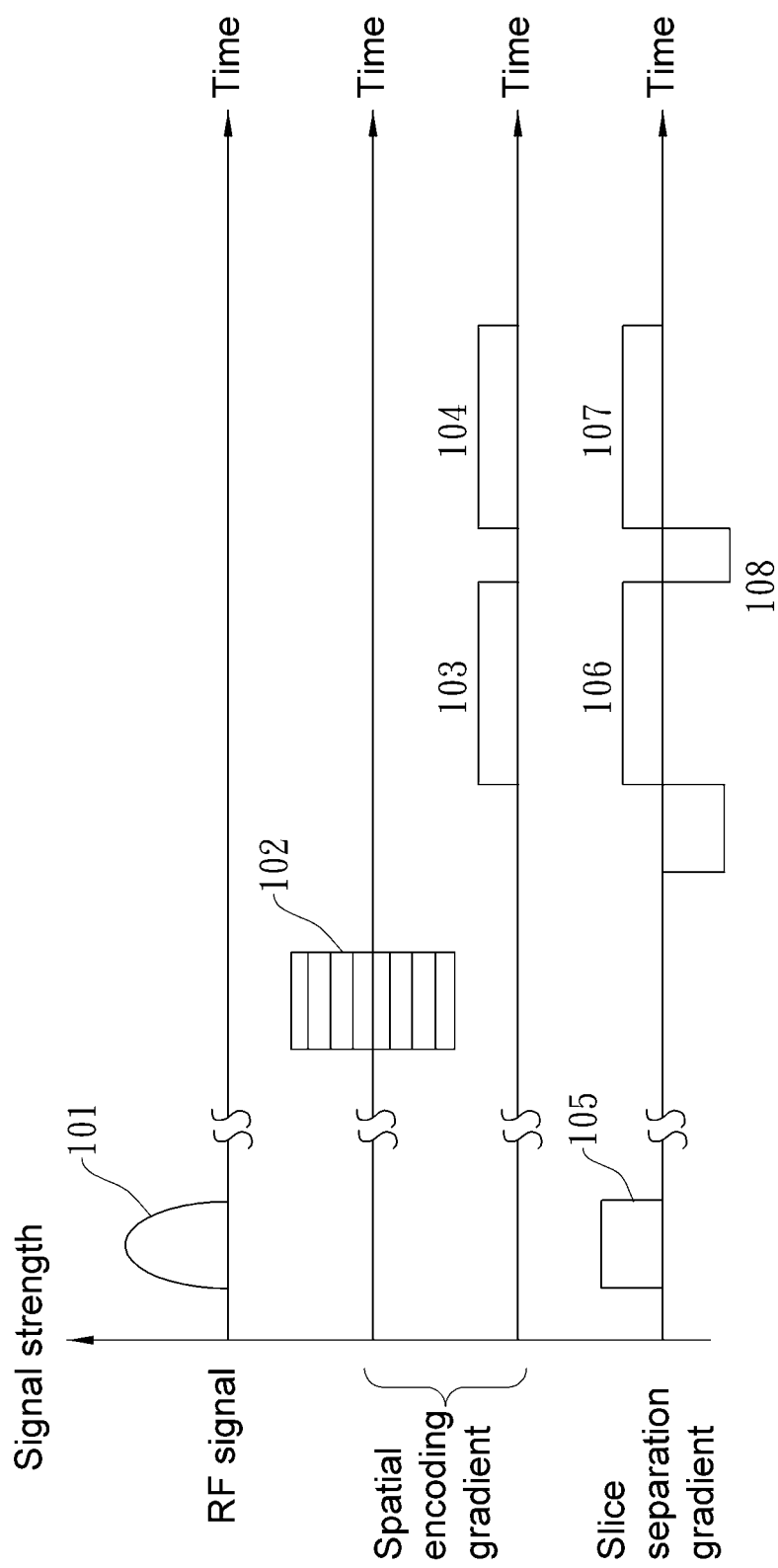
FIG. 5 is a timing sequence diagram, showing the timing sequence of control of the method for simultaneously acquiring multi-slice MRI signals of FIG. 5.

FIG. 5 is a timing diagram illustrating the control of the system of FIG. 3 when implementing the process of FIG. 4.

Referring to FIG. 3 and FIG. 5, the controller module 71 can receive the control instructions sent by the user from the input device 53 and cooperates with a preset program stored in the storage module 72 to make the sequence controller 1 execute the method of FIG. 4.

The sequence controller 1 can be configured to output driving signals to drive the activation of the RF excitation module 21, the RF receiving module 22 and the gradient output module 4, wherein the control steps in accordance with one embodiment are as follows:

i. The sequence controller 1 drives the RF excitation module 21 to generate to the subject 6 one or more than one RF pulse 101 that carries at least two frequency components. For example, the RF pulse 101 carries frequencies $f_1$ and $f_2$, which have a difference $f_{sep}$ meeting Eq. 2. The sequence controller 1 drives the gradient controller 41 to control the gradient coils 42 for generating the slice-selection gradient $G_{ss}$ 105.

ii. The sequence controller 1 drives the gradient controller 41 to control the plurality of gradient coils 42 for generating a plurality of spatial encoding gradient $G_{spen}$ 102, 103, 104 to the subject 6, with respect to each encoding direction for each slice.

iii. The sequence controller 1 drives the gradient controller 41 to control the plurality of gradient coils 42 for generating to the subject 6 a plurality of separation gradients $G_{sep}$ 106, 107.

iv. The sequence controller 1 drives the gradient controller 41 to control the plurality of gradient coils 42 for generating to the subject 6 at least one coherent refocusing gradient $G_C$ 108 between the plurality of separation gradients $G_{sep}$ 106, 107.

In this example, the spatial encoding gradient $G_{spen}$ comprises a phase-encoding gradient 102 and frequency-encoding gradients 103, 104 and, in the course of applying the spatial encoding gradient $G_{spen}$, the plurality of separation gradients $G_{sep}$ 106, 107 are applied while the MRI signals excited from the subject 6 are received. The ratio of $G_{sep}$ to $G_{spen}$, which cooperates with $G_{sep}$ to receive the MRI signals, should meet Eq. 3 so that two adjacent slices can be separated completely.

In particular, one of the plurality of separation gradients and at least one of the spatial encoding gradients are simultaneously applied. For example, the frequency-encoding gradients 103 and the separation gradient $G_{sep}$ 106 are simultaneously applied. Moreover, the frequency-encoding gradients 104 and the separation gradient $G_{sep}$ 107 are simultaneously applied.

Depending on different embodiments, the receiving module 22 can receive the MRI signals excited from the subject 6 while the frequency-encoding gradients 103, 104 and the at least one slice separation gradient 105 are applied. The MRI signals can then be reconstructed by the image processing module 73 which performs transformation such as spatial encoding and 2D Fourier transform, so as to give the real-time image data of the slices. The reconstructed data, which are the images of the separated slices, can then be output to be displayed on a display device 52.

The difference between 3D MRI and 2D MRI is that in the latter, one slice is excited in one scan and then the image information is given through 2D spatial encoding, whereas in the former one slab is excited in one scan and then the image information is given through 3D spatial encoding.

Figure 6:
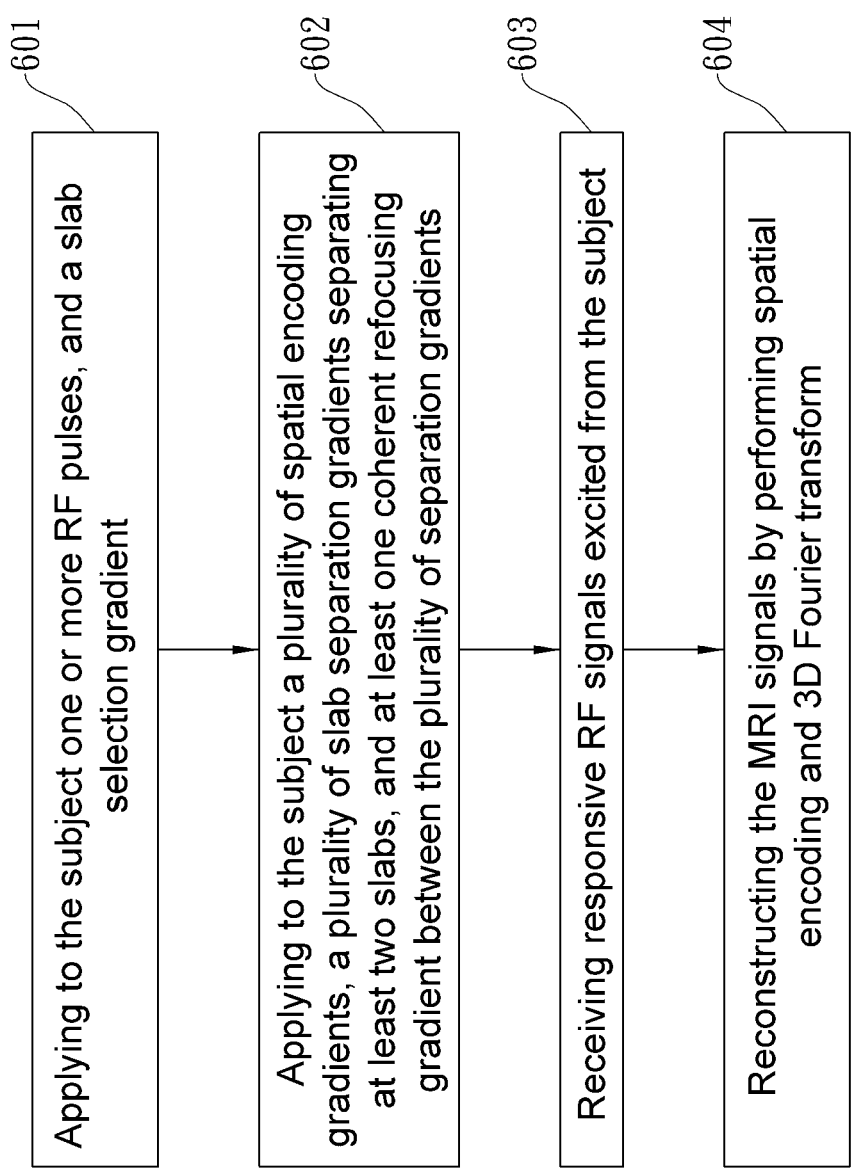
FIG. 6 is a flow chart illustrating an example method for simultaneously acquiring multi-slab MRI signals, wherein the apparatus is capable of imaging in accordance with another embodiment.

FIG. 6 is a flowchart illustrating an exemplary method for 3D MRI in accordance with one embodiment.

Referring to FIG. 3 and FIG. 6, in step 601, the RF excitation module 21 is controlled for applying one or more than one RF pulse, which carries at least two frequency components, and a slab selection gradient to the subject 6, so that at least two slabs of the subject 6 respectively corresponding to the at least two frequency components are excited simultaneously.

For example, the RF pulse 101 carrying frequencies $f_1$ and $f_2$ for exciting two slabs has $f_1$ and $f_2$ designed to have a frequency difference $f_{sep}$ as demonstrated by Eq. 2.

In step 602, the gradient output module 4 applies to the subject 6 a plurality of spatial encoding gradients $G_{spen}$, a plurality of slab separation gradients $G_{sep}$ for separating the at least two slabs, and at least one coherent refocusing gradient $G_C$ between the plurality of separation gradients $G_{sep}$. The spatial encoding gradient $G_{spen}$ comprises a phase-encoding gradient $G_Y$, a frequency-encoding gradient $G_X$, and a slab-selection gradient $G_Z$.

The ratio of $G_{sep}$ to $G_{spen}$ should satisfy Eq. 3, wherein $G_{spen}$ may be the phase-encoding gradient $G_Y$, the frequency-encoding gradient $G_X$ or the slab-selection gradient $G_Z$ and cooperates with $G_{sep}$ to receive MRI signals.

In step 603, the gradient output module 4, in the course of applying the spatial encoding gradients, cooperates with the RF receiving module 22 to receive responsive RF signals excited from the subject 6.

In step 604, the MRI signals are reconstructed by performing spatial encoding and 3D Fourier transform to the responsive RF signals, so as to give the real-time image of each slab.

Figure 7:
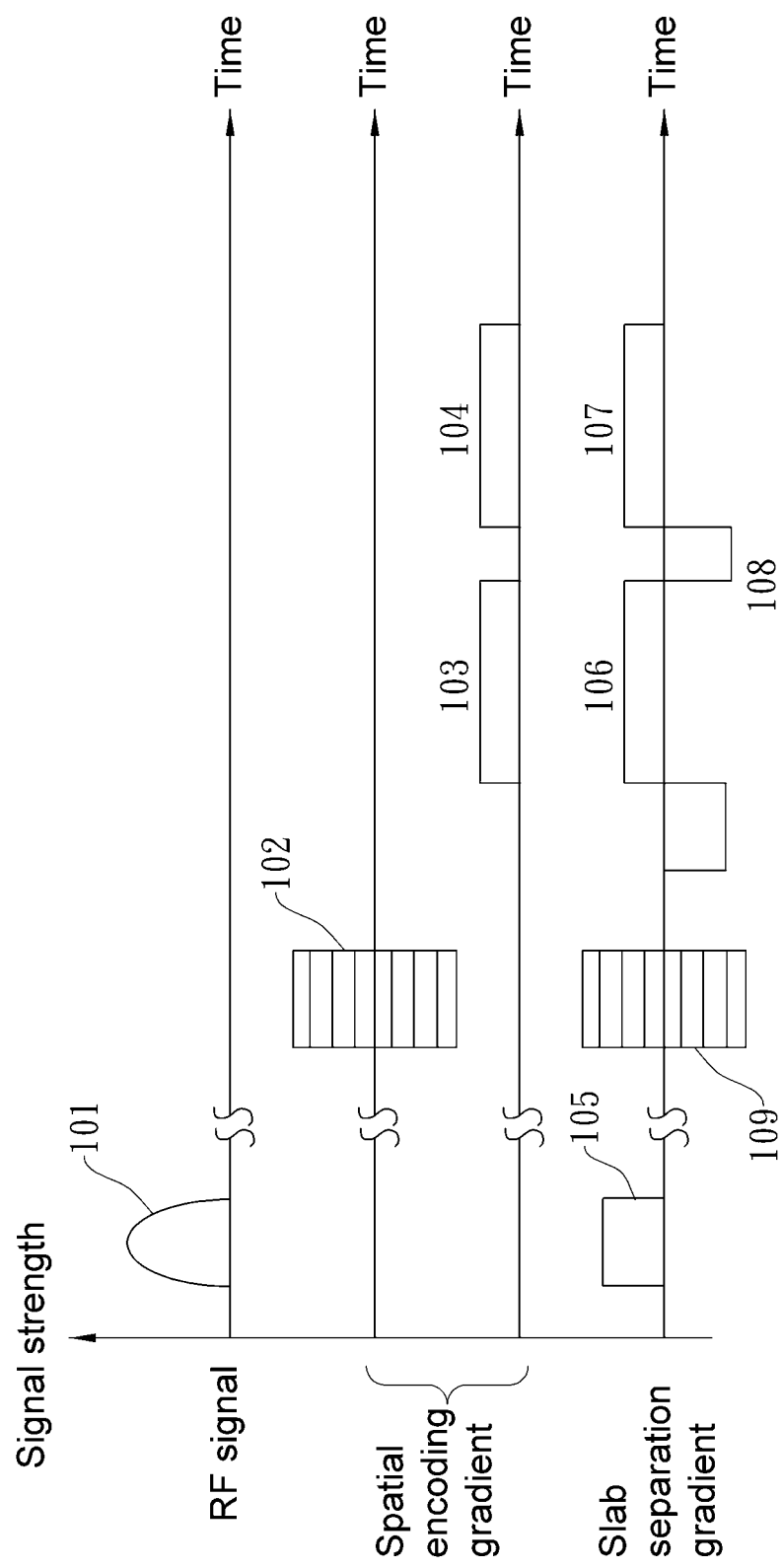
FIG. 7 is a timing sequence diagram also showing the timing sequence of control of the method for simultaneously acquiring multi-slab MRI signals of FIG. 6.

FIG. 7 is a timing diagram illustrating the control of the system of FIG. 3 when implementing the process of FIG. 6.

Referring to FIG. 3 and FIG. 7, the controller module 71 can receive the control instructions sent by the user from the input device 53 and cooperates with a preset program stored in the storage module 72 to make the sequence controller 1 execute the method of FIG. 6.

The sequence controller 1 can be configured to output driving signals to drive the activation of the RF excitation module 21, the RF receiving module 22 and the gradient output module 4. The control steps in accordance with one embodiment are as follows:

i. The sequence controller 1 drives the RF excitation module 21 to generate to the subject 6 one or more than one RF pulse 101 that carries at least two frequency components. For example, the RF pulse 101 carries frequencies $f_1$ and $f_2$, which have a difference $f_{sep}$ satisfying Eq. 2. The sequence controller 1 drives the gradient controller 41 to control the gradient coils 42 for generating the slab-selection gradient $G_{ss}$ 105.

ii. The sequence controller 1 drives the gradient controller 41 to control the plurality of gradient coils 42 for generating a plurality of spatial encoding gradient $G_{spen}$ to the subject 6 with respect to each encoding direction for each slab.

iii. The sequence controller 1 drives the gradient controller 41 to control the plurality of gradient coils 42 for generating to the subject 6 a plurality of separation gradients $G_{sep}$ 106, 107.

iv. The sequence controller 1 drives the gradient controller 41 to control the plurality of gradient coils 42 for generating to the subject 6 at least one coherent refocusing gradient $G_C$ 108 between the plurality of separation gradients $G_{sep}$ 106, 107.

In this example, the spatial encoding gradient $G_{spen}$ comprises a phase-encoding gradient 102, frequency-encoding gradients 103, 104 and a slab-selection gradient 109. In the course of applying the spatial encoding gradient $G_{spen}$, the plurality of separation gradients $G_{sep}$ 106, 107 are applied while the MRI signals excited from the subject 6 are received. The ratio of $G_{sep}$ to $G_{spen}$, which cooperates with $G_{sep}$ to receive the MRI signals, should satisfy Eq. 3 so that two adjacent slabs can be separated completely.

In particular, one of the plurality of separation gradients $G_{sep}$ and at least one of the spatial encoding gradients $G_{spen}$ are simultaneously applied. For example, the frequency-encoding gradients 103 and the separation gradient $G_{sep}$ 106 are simultaneously applied. Moreover, the frequency-encoding gradients 104 and the separation gradient $G_{sep}$ 107 are simultaneously applied.

Depending on different embodiments, the receiving module 22 can receive the MRI signals excited from the subject 6 while the frequency-encoding gradients 103, 104 and the at least one slab separation gradient 105 are applied. The MRI signals can then be reconstructed by the image processing module 73 which performs transformation such as spatial encoding and 2D Fourier transform, so as to give the real-time image data of the slabs. The reconstructed data, which are the images of the separated slabs, can then be output to be displayed on a display device 52.

Two separation gradients in the above description are applied to obtain one scan line. However, in other embodiments, the number of the plurality of separation gradients $G_{sep}$ is not limited to two. In one embodiment, the number of the plurality of separation gradients $G_{sep}$ is determined by filtering shape data. The filtering shape data are the detected responsive RF signals emitted from the subject 6 without applying any coherent refocusing gradient $G_C$ 108. The detailed description of the filtering shape data will be given below.

Figure 8:
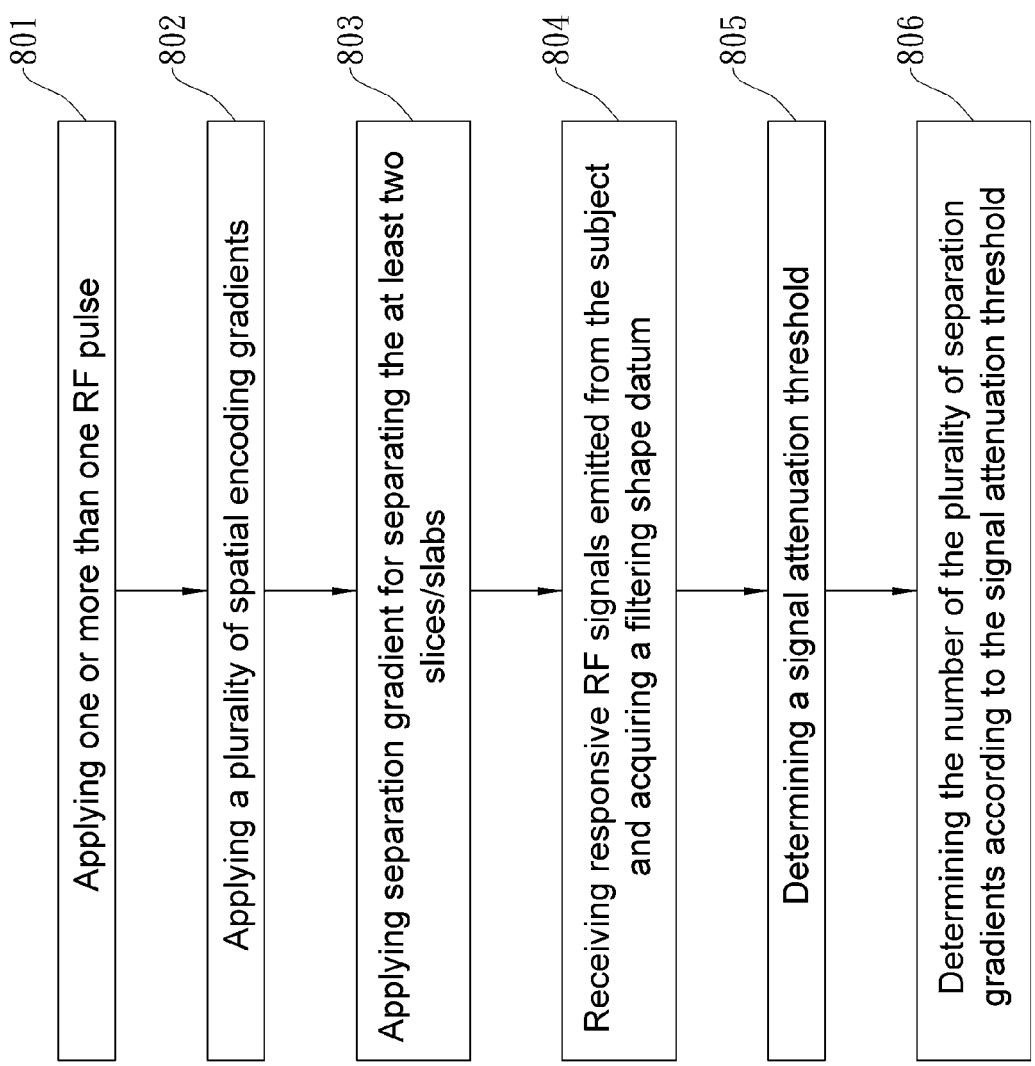
FIG. 8 is a flowchart illustrating an exemplary method for determining the number of the plurality of separation gradients.

FIG. 8 is a flowchart illustrating an exemplary method for determining the number of the plurality of separation gradients $G_{sep}$. In step 801, one or more than one RF pulse 101 is applied. In step 802, a plurality of spatial encoding gradients $G_{spen}$ are applied. The spatial encoding gradient $G_{spen}$ comprises the phase-encoding gradient 102 and one frequency-encoding gradient. In step 803, a separation gradient for separating the at least two slices/slabs is applied. In step 804, responsive RF signals emitted from the subject 6 are received and the filtering shape datum is acquired.

In step 805, determine a signal attenuation threshold. One example of the acquired filtering shape data is shown in FIG. 9A. In this example, the intensity of the signals after t1 is lower than the signal attenuation threshold. The signal having low intensity results in image blur. In step 806, determine the number of the plurality of separation gradients $G_{sep}$ according to the signal attenuation threshold. As show in FIG. 9B, to meet the signal attenuation threshold, two separation gradients are applied in this example. More specifically, two separation gradients having the duration T are applied. In other words, one coherent refocusing gradient $G_C$ is applied between two separation gradients as shown in FIGS. 5 and 7.

The number of the coherent refocusing gradient is determined according to the number of the plurality of separation gradients $G_{sep}$. As described above, at least one coherent refocusing gradient is applied between the plurality of separation gradients $G_{sep}$. Therefore, when the number of the plurality of separation gradients $G_{sep}$ is S, the number of the coherent refocusing gradient is S−1.

In another embodiment, the filtering shape data are acquired by simulation. Therefore, the determination of the number of the plurality of separation gradients $G_{sep}$ is dependent upon a result of the simulation.

The total duration of the separation gradients $G_{sep}$ is the time of acquiring a slice/slab. For example, if a MR image of 256 points to read out is to be required, the total duration of the separation gradients $G_{sep}$ is the time for acquiring 256 RF signals corresponding to 256 points. An intensity and duration of the at least one coherent refocusing gradient are determined according to an intensity and duration of the plurality of separation gradients $G_{sep}$. In one embodiment, the product of the intensity and duration of the coherent refocusing gradient is equal to the product of intensity and duration of the plurality of separation gradients $G_{sep}$ applied after the coherent refocusing gradient. As a result, the degree of dephasing of nuclei in the object is controlled or decreased.

In one embodiment, the number of the separation gradients $G_{sep}$ is a number of the pixels of the slice/slab. For example, if a MR image of 256 points to read out is to be required, the number of separation gradients $G_{sep}$ is 256. Then, the responsive RF signals are sampled 256 times and the number of the refocusing gradients is 255. In this embodiment, the separation gradients and the refocusing gradient are switched at a high rate. Since the refocusing is complete between each sampling points, all the responsive RF signals will not suffer any filtering effect.

In one embodiment, the responsive RF signals are received only when the separation gradients are applied. In this embodiment, all responsive RF signals are used for reconstructing the magnetic resonance images.

Figure 10:
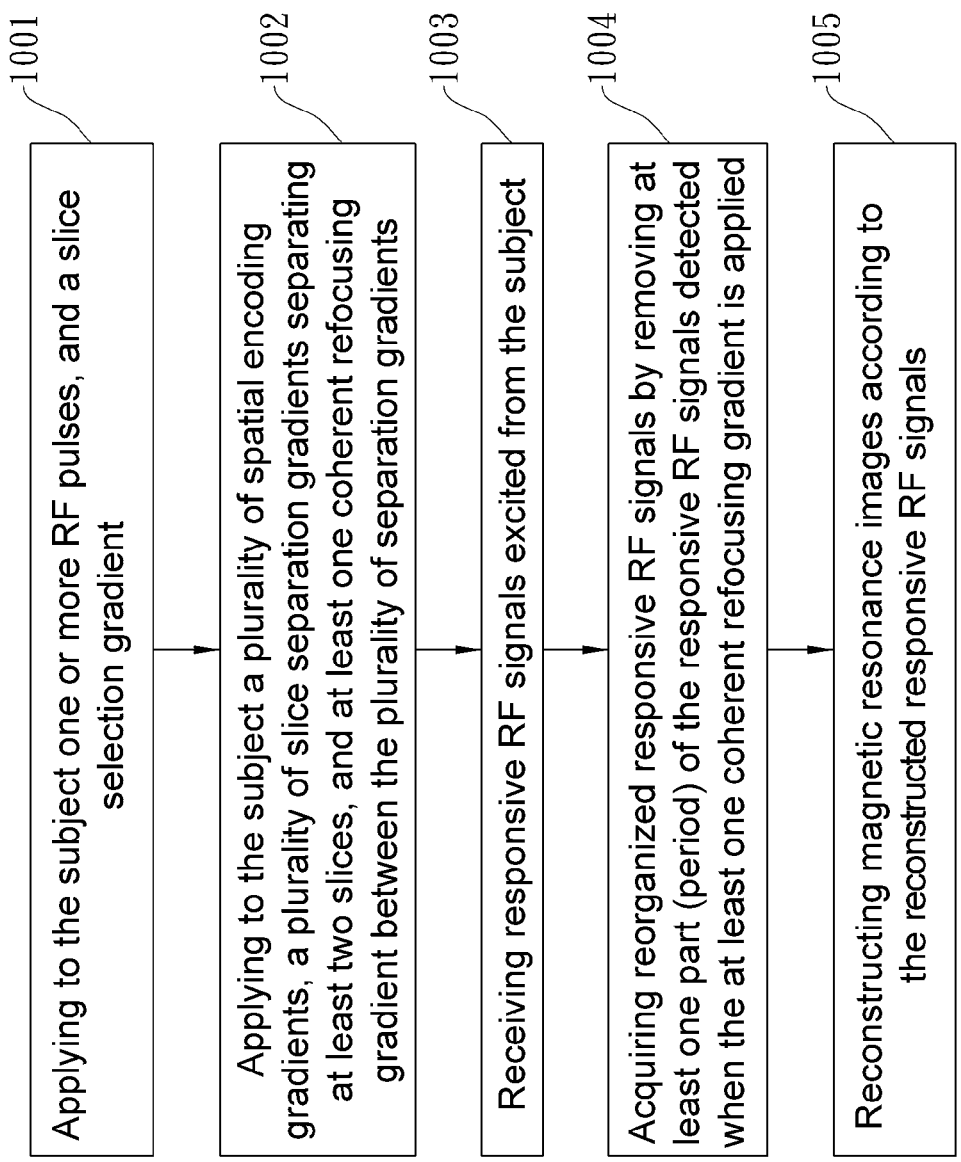
FIG. 10 is a flowchart illustrating an exemplary method for MRI in accordance with one embodiment.

In one embodiment, the responsive RF signals are received when the separation gradients and at least one refocusing gradient are applied. FIG. 10 is a flowchart illustrating an exemplary method for MRI in accordance with the above embodiment. Steps 1001-1003 are the same as the steps 401-403. In step 1004, reorganized responsive RF signals are acquired by removing at least one part (period) of the responsive RF signals detected when the at least one coherent refocusing gradient is applied. The part (period) of the responsive RF signals detected when the at least one coherent refocusing gradient is applied are not useful for reconstructing magnetic resonance images since the spatial encoding gradients are not applied. In step 1005, magnetic resonance images are reconstructed according to the reorganized responsive RF signals.

In some applications, gradients such as spatial encoding gradients and separation gradients are not ideal. FIG. 11 shows one non-ideal example of the separation gradients. As shown in FIG. 11, there is transition time T for switching from the separation gradients 106 to the coherent refocusing gradient 108 and from the coherent refocusing gradient 108 to the separation gradients 107. Wherein the transition time T exists at the edges of the gradients. For solving the non-ideal gradients problem, in some embodiment, the responsive RF signals are received except the transition time T. In this embodiment, all responsive RF signals are used for reconstructing the magnetic resonance images.

To compensate the non-ideal response of gradients, additional overdrive signals 110 are added into the gradients, such as separation gradients and spatial encoding gradients, and the refocusing gradients to make the transition speed fast enough. FIG. 12A shows the Input gradient waveform with the additional overdrive signals. FIG. 12B shows actual gradient waveform. The actual gradient waveform would be the waveform of the separation gradients 106 107 and the refocusing gradients 108.

Figure 13:
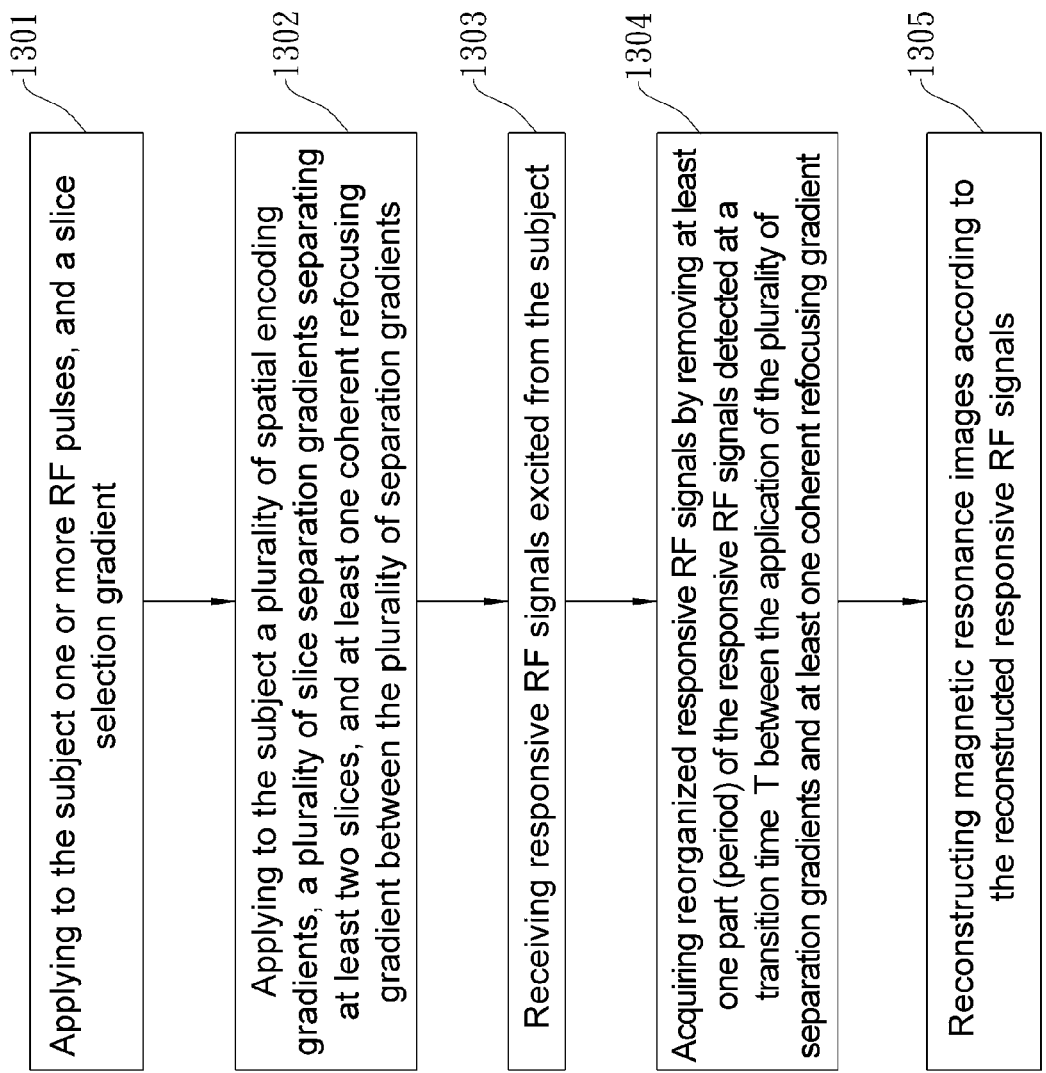
FIG. 13 is a flowchart illustrating an exemplary method for MRI in accordance with one embodiment.

In another embodiment, the responsive RF signals are still received during every separation gradient and refocusing gradient. Then, some of the responsive RF signals are removed for solving the above problem. FIG. 13 is a flowchart illustrating an exemplary method for MRI in accordance with the above embodiment. Steps 1301-1303 are the same as the steps 401-403. In step 1304 reconstructed reorganized responsive RF signals are acquired by removing at least one part (period) of the responsive RF signals detected at the transition time T between the application of the plurality of separation gradients and at least one coherent refocusing gradient. The part (period) of the responsive RF signals detected at the transition time are not useful for reconstructing magnetic resonance images since the gradients values are not correct. In step 1305, magnetic resonance images are reconstructed according to the reorganized responsive RF signals.

What is claimed is:

1. A method for acquiring magnetic resonance imaging (MRI) signals, including:
   applying, by a RF excitation device, one or more than one RF pulse, wherein each RF pulse carries at least two frequency components, and a slice/slab selection gradient to a subject, so that at least two slices/slabs of the subject respectively corresponding to the at least two frequency components are excited simultaneously;
   applying, by a gradient output device, a plurality of spatial encoding gradients to the subject;
   applying, by the gradient output device, a plurality of separation gradients to the subject for separating the at least two slices/slabs;
   determining the number of the plurality of separation gradients; and
   applying, by the gradient output device, at least one coherent refocusing gradient to the subject between the plurality of separation gradients, wherein the determination of the number of the plurality of separation gradients includes determining a signal attenuation threshold.

2. The method for acquiring MRI signals of claim 1, wherein one of the plurality of separation gradients and at least one of the spatial encoding gradients are simultaneously applied.

3. The method for acquiring MRI signals of claim 1, further including determining the number of the at least one coherent refocusing gradient according to the number of the plurality of separation gradients.

4. The method for acquiring MRI signals of claim 1, wherein the determination of the number of the plurality of separation gradients is dependent upon a filtering shape data.

5. The method for acquiring MRI signals of claim 4, further including acquiring the filtering shape data, wherein the acquisition of the filtering shape data includes:
   applying one or more than one RF pulse;
   applying the plurality of spatial encoding gradients;
   applying a separation gradient for separating the at least two slices/slabs.

6. The method for acquiring MRI signals of claim 1, wherein the determination of the number of the plurality of separation gradients is dependent upon a simulation result.

7. The method for acquiring MRI signals of claim 1, wherein the determination of the number of the plurality of separation gradients is dependent upon the signal attenuation threshold.

8. The method for acquiring MRI signals of claim 7, further including determining an intensity and duration of the at least one coherent refocusing gradient according to an intensity and duration of the plurality of separation gradients.

9. The method for acquiring MRI signals of claim 1, further including receiving one or more than one responsive RF signals emitted from the subject.

10. The method for acquiring MRI signals of claim 9, further including reconstructing magnetic resonance images according to the responsive RF signals.

11. The method for acquiring MRI signals of claim 1, wherein the spatial encoding gradients comprise a phase-encoding gradient and one or more frequency-encoding gradient.

12. The method for acquiring MRI signals of claim 1, further including:
   receiving one or more than one responsive RF signals emitted from the subject;
   acquiring reorganized responsive RF signals by removing at least one part (period) of the responsive RF signals detected when the at least one coherent refocusing gradient is applied; and
   reconstructing magnetic resonance images according to the reorganized responsive RF signals.

13. The method for acquiring MRI signals of claim 1, further including:
   receiving one more than one responsive RF signals emitted from the subject;
   acquiring reorganized responsive RF signals by removing at least one part (period) of the responsive RF signals detected at a transition time between the application of the plurality of separation gradients and at least one coherent refocusing gradient; and
   reconstructing magnetic resonance images according to the reorganized responsive RF signals.

14. The method for acquiring MRI signals of claim 1, wherein the number of the separation gradients is a number of the pixels of the slice/slab.

15. The method for acquiring MRI signals of claim 1, wherein additional overdrive signals are added into the separation gradients and the refocusing gradients.

16. An apparatus for simultaneously acquiring multi-slice/slab MRI images from a subject, the apparatus being capable of imaging by generating a MRI signal from the subject, the apparatus comprising:
   an RF excitation device, being controlled for applying one or more than one RF pulse, wherein each RF pulse carries at least two frequency components, and a slice/slab selection gradient to the subject, so that at least two slices/slabs of the subject respectively corresponding to the at least two frequency components are excited simultaneously; and
   a gradient output device, being controlled for applying a plurality of spatial encoding gradients; applying a plurality of separation gradients for separating the at least two slices/slabs; determining the number of the plurality of separation gradients; and applying at least one coherent refocusing gradient between the plurality of separation gradients, wherein the determination of the number of the plurality of separation gradients includes determining a signal attenuation threshold.

17. The apparatus for acquiring MRI images of claim 16, wherein the number of the plurality of separation gradients is determined according to filtering shape data.

18. The apparatus for acquiring MRI images of claim 17, wherein the number of the at least one coherent refocusing gradient is determined according to the number of the plurality of separation gradients.

* * * * *